United States Patent [19]

McKenzie et al.

[11] Patent Number: 4,568,885
[45] Date of Patent: Feb. 4, 1986

[54] FULLY DIFFERENTIAL OPERATIONAL AMPLIFIER WITH D.C. COMMON-MODE FEEDBACK

[75] Inventors: James A. McKenzie; Joe W. Peterson, both of Austin, Tex.

[73] Assignee: Motorola, Inc., Schaumburg, Ill.

[21] Appl. No.: 728,629

[22] Filed: Apr. 29, 1985

[51] Int. Cl.[4] .................. H03F 3/45; H03F 3/16
[52] U.S. Cl. .................. 330/253; 330/258; 330/277; 330/288
[58] Field of Search ......... 330/51, 253, 257, 258, 330/259, 261, 288, 277; 323/315, 316

[56] References Cited

U.S. PATENT DOCUMENTS 4,271,394 6/1981 Leidich ........................ 330/253 X
4,272,728 6/1981 Wittlinger ..................... 330/261 X
4,502,019 2/1985 Van Roermund ............. 330/261

Primary Examiner—Eugene R. LaRoche
Assistant Examiner—Steven J. Mottola
Attorney, Agent, or Firm—Anthony J. Sarli, Jr.; Jeffrey Van Myers; Robert L. King

[57] ABSTRACT

A fully differential operational amplifier is provided having a common-mode feedback portion which accurately sets the common-mode output voltage at a predetermined value. The feedback portion utilizes a pair of parallel transistors which source a combined current which is used to provide a common-mode control voltage relative to a reference common-mode current. The common-mode control voltage controls load devices of the operational amplifier in a manner such that a differential output voltage remains centered about the predetermined common-mode output voltage.

6 Claims, 3 Drawing Figures

FULLY DIFFERENTIAL OPERATIONAL AMPLIFIER WITH D.C. COMMON-MODE FEEDBACK

CROSS REFERENCE TO RELATED APPLICATION

Application Ser. No. 06/728,628 entitled, "A Clocked Gain Stage Having Differential Inputs And Outputs", filed simultaneously herewith by Joe W. Peterson.

TECHINCAL FIELD

This invention relates generally to amplifiers, and more particularly, to operational amplifiers having differential inputs and differential outputs.

BACKGROUND ART

A general class of amplifiers includes fully differential operational amplifiers having two inputs and two outputs. Fully differential operational amplifiers have the advantage of providing good power supply rejection. Operational amplifiers with differential outputs have a maximum dynamic range of input voltage only when the common-mode D.C. output voltage is at the midpoint value of the power supply voltages. A fully differential operational amplifier which functions to maintain the D.C. common-mode output voltage at an optimum value for dynamic output voltage range is taught by Roger A. Whatley in U.S. patent application Ser. No. 682,873. However, such differential operational amplifiers typically have several low frequency poles which must be compensated in most applications to prevent oscillation. Further, a fully differential operational amplifier with fewer transistors may be desirable in applications where size is an extreme limitation.

BRIEF DESCRIPTION OF THE INVENTION

Accordingly, an object of the present invention is to provide an improved fully differential operational amplifier.

Another object of the present invention is to provide an improved fully differential operational amplifier which uses D.C. common-mode feedback.

Yet another object of the present invention is to provide an improved differential output operational amplifier circuit having an output voltage with a maximized dynamic range.

A further object of the present invention is to provide an improved differential output operational amplifier circuit which minimizes circuitry.

In carrying out the above and other objects of the present invention, there is provided, in one form, a fully differential operational amplifier generally comprising first current source means for providing a first constant source current. A first differential input means is coupled to the first current source means for selectively receiving a first input voltage and providing a first output voltage in response thereto. A second differential input means is coupled to the current source means, for selectively receiving a second input voltage and providing a second output voltage in response thereto. First and second load means are respectively coupled to the first and second differential input means, for respectively sinking first and second differential currents in response to a common-mode control voltage. Common-mode feedback means are provided for maintaining a common-mode output voltage at a predetermined value. First and second parallel-connected transistors of the feedback means provide a first bias current, and a third transistor of the feedback means provides a second bias current. Output means coupled to the first, second and third transistors provide the common-mode control voltage in proportion to the first and second bias currents. These and other objects, features and advantages will be more clearly understood from the following detailed description taken in conjunction with the accompanying drawings.

DETAILED DESCRIPTION OF THE INVENTION

Figure 1:
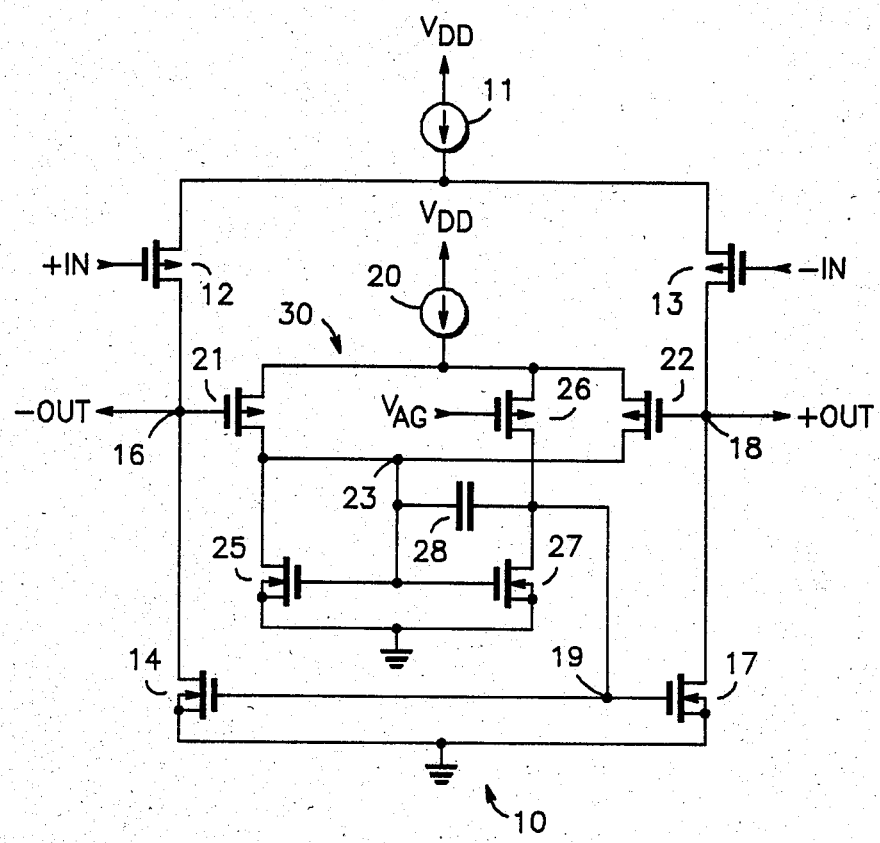
FIG. 1 illustrates in schematic form a fully differential operational amplifier in accordance with the present invention.

Shown in FIG. 1 is a fully differential operational amplifier 10 illustrating one form of the present invention. A current source 11 has a first terminal connected to a power supply voltage $V_{DD}$ and a second terminal connected to a source of both P-channel transistors 12 and 13. A gate of transistor 12 provides a positive input terminal for receiving a positive input voltage, and a gate of transistor 13 provides a negative input terminal for receiving a negative input voltage. A drain of transistor 12 is connected to a drain of an N-channel transistor 14 via a first output terminal 16 for providing a negative output voltage referenced to a predetermined voltage such as analog ground, $V_{AG}$. Transistor 14 has a source connected to a second supply voltage potential such as earth ground potential and has a gate. A drain of transistor 13 is connected to a drain of an N-channel transistor 17 via a second output terminal 18 which provides a positive output voltage referenced to analog ground. A source of transistor 17 is connected to earth ground. A gate of transistor 17 is connected to the gate of transistor 14 at a common-mode output node 19. A current source 20 has a first terminal coupled to power supply voltage $V_{DD}$ and a second terminal connected to a source of both P-channel transistors 21 and 22. A gate of transistor 21 is connected to output terminal 16, and a gate of transistor 22 is connected to output terminal 18. Each of transistors 21 and 22 has a drain connected together at a node 23. An N-channel transistor 25 has both a drain and a gate connected to node 23 and has a source connected to earth ground. A P-channel transistor 26 has a source connected to the second terminal of current source 20, a gate coupled to analog ground and a drain connected to a drain of an N-channel transistor 27 via node 19. A gate of transistor 27 is connected to the gate of transistor 25 at node 23, and a source of transistor 27 is connected to earth ground. A capacitor 28 has a first electrode connected to node 23 and a second electrode connected to node 19. In a preferred form, the source of each of N-channel transistors 14, 17, 25 and 27 is connected to the substrate thereof to minimize conventional Body effects. While specific N-channel and P-channel MOS devices are shown, it should be obvious that operational amplifier 10 may be implemented by completely reversing the processing techniques (e.g. P-channel to N-channel) or by using other types of transistors.

In operation, assume that the positive and negative inputs of operational amplifier 10 receive substantially equal input voltages. Therefore, transistors 12 and 13, if sized with substantially equal physical dimensions, will each conduct approximately one-half of the current supplied by current source 11. Transistors 14 and 17 function as output load devices. When the input voltages are approximately equal, transistors 14 and 17 conduct approximately equal currents and have equal gate-to-source voltages. Therefore, the output voltages at terminals 16 and 18 are approximately equal.

In the illustrated form, transistors 21, 22, 25, 26 and 27 and current source 20 function as a common-mode feedback amplifier 30. Transistors 12, 13, 14 and 17 function as a main amplifier portion of operational amplifier 10. A negative feedback path between node 19 and output nodes 16 and 18 via transistors 14 and 17, respectively, places common-mode feedback amplifier 30 in a closed loop configuration which forces the output voltages to be balanced. Assuming that the output voltages are substantially equal, transistors 21 and 22 of feedback amplifier 30 are biased so that the gate-to-source voltage of each of transistors 21 and 22 is the same. Transistors 21, 22 and 26 are proportionately sized with respect to each other so that transistor 26 conducts a known amount of current with respect to the combination of transistors 21 and 22. Transistor 26 is biased by a predetermined common-mode output voltage, $V_{AG}$. Therefore, the bias voltages applied to transistors 21 and 22 determine the amount of common-mode feedback voltage applied to the main amplifier comprising transistors 12, 13, 14 and 17. In a preferred form, each of transistors 21 and 22 is sized approximately one-half the size of transistor 26. Therefore, when transistors 21 and 22 are biased with equal voltages, transistors 21 and 22 which are connected in series with transistor 25 effectively appear to be one transistor coupled in parallel with transistor 26. In a balanced output voltage condition with the assumed transistor geometries, transistor 26 conducts one-half of the current supplied by current source 20 in response to the common-mode output voltage $V_{AG}$, and transistors 21 and 22 equally conduct one-half of the current from current source 20. The voltage potential at common-mode output node 19 adjusts accordingly so that the current through transistor 26 equals the sum of the currents through transistors 21 and 22. Regardless of the absolute value of the equal voltages applied to the positive and negative inputs, common-mode amplifier 30 will provide a bias voltage at node 19 which will force the output voltages at nodes 16 and 18 to $V_{AG}$. Therefore, the common-mode output voltage is established with balanced input voltages and a differential output voltage of zero volts.

Whenever a differential input voltage is applied to the gates of transistors 12 and 13, the output voltages at nodes 16 and 18 will reflect an output voltage which is equal to the product of the input voltage differential and the gain of amplifier 10. The gain of amplifier 10 is determined by transistors 12, 13, 14 and 17 and current source 11 in a conventional manner. This circuit operation has assumed that operational amplifier 10 has remained in a linear region of operation. In other words, no output signal clipping has occurred due to a saturated output condition of operation. Additionally, common-mode feedback amplifier 30 must remain in the linear operating region. The differential summing function provided by transistors 21 and 22 both with respect to the negative feedback function and with respect to the overall functional operation of amplifier 10 must be linear. By adjusting the width and length of the control electrode regions of transistors 21 and 22, the second derivative of the ratio of the current and gate-to-source voltage of each of transistors 21 and 22 is minimized in a conventional manner to provide substantially linear operation.

When the input voltage at the gate of transistor 12 is increased by an amount, say $\Delta V$, a differential voltage equal to the product of the gain of the primary amplifier and $\Delta V$ will appear across the output nodes 16 and 18. Common-mode feedback amplifier 30 functions to provide negative feedback to transistors 14 and 17 and make the average value of the differential output voltage equal to the predetermined value of $V_{AG}$. The common-mode output voltage will remain equal to $V_{AG}$ as long as the sum of the currents through transistors 21 and 22 is equal to the current through transistor 26. Common-mode feedback amplifier 30 cannot change the amount of voltage differential appearing across the output nodes 16 and 18, but functions to vary the absolute values of the output voltages in response to the input voltage differential in order to maintain the common-mode output voltage at a fixed value.

In particular, if the output voltages at the gates of transistors 21 and 22 both increase, transistors 21 and 22 conduct less and transistor 26 must conduct more. As a result, the voltage potential at node 19 rises slightly making transistors 14 and 17 conduct more. The net effect of the action of transistors 14 and 17 is to lower the voltage potential at output nodes 16 and 18. The reduced voltage potential causes transistors 21 and 22 to conduct more current until a balance of current is established between transistors 21 and 22 and transistor 26. As a result, the voltage differential at nodes 16 and 18 is not changed but the differential is translated so that the difference is centered about $V_{AG}$. An exactly opposite but analogous circuit operation occurs if the voltage potential at the gates of transistors 21 and 22 decreases. Because the closed-loop common-mode feedback of operational amplifier 10 has two dominant frequency poles, capacitor 28 may be provided to insure that operational amplifier 10 does not oscillate. However, no frequency compensating capacitor is needed for the main amplifier portion of operational amplifier 10 because the main amplifier portion only has one dominant frequency pole.

Figure 2A:
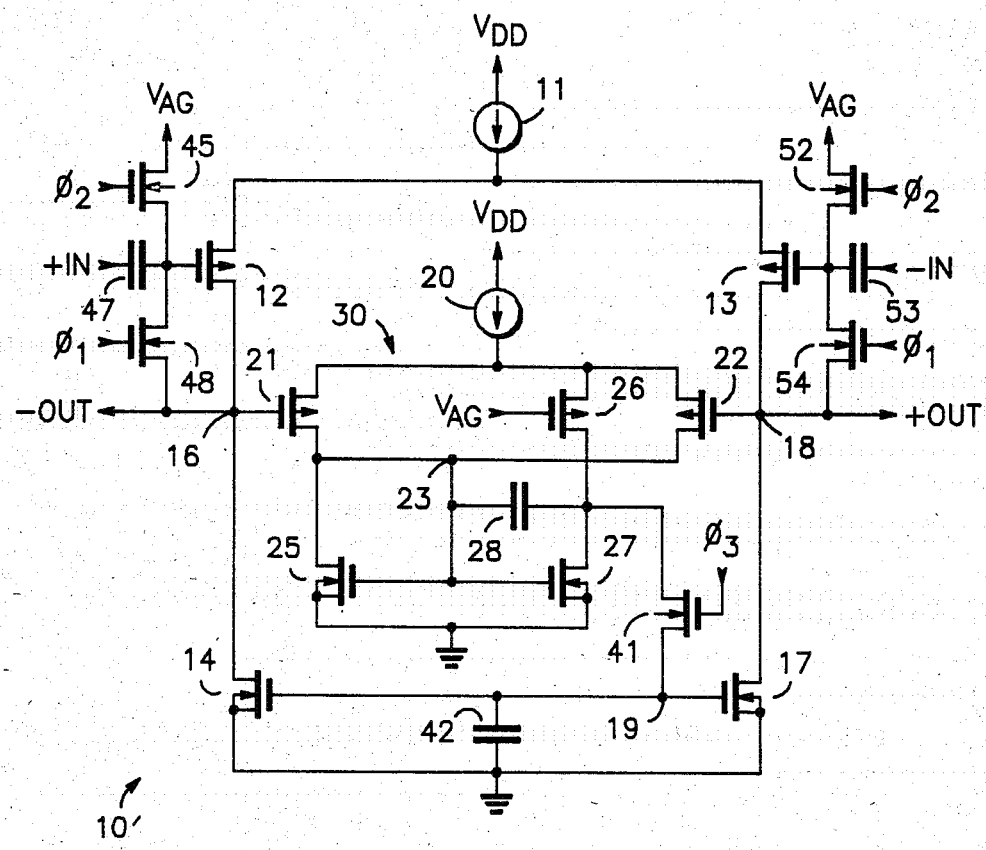
FIG. 2(A) illustrates in schematic form another embodiment of the present invention.
Figure 2B:
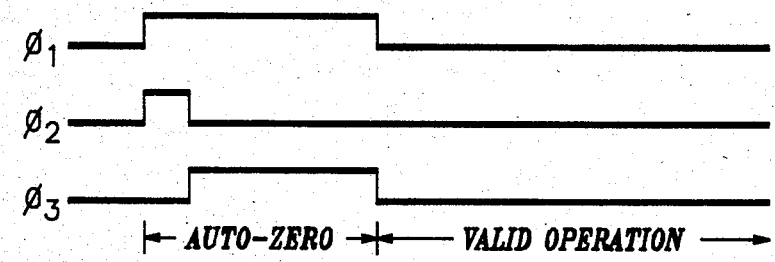
FIG. 2(B) illustrates in graphical form timing signals associated with the circuit of FIG. 2(A).

Shown in FIG. 2(A) is another embodiment of the present invention illustrating an autozeroed fully differential A.C. coupled amplifier 10' with common-mode feedback. Circuit elements which are common to FIG. 1 are illustrated in FIG. 2(A) by the same number. An N-channel transistor 41 has a drain connected to the drain of transistor 27, a gate coupled to a control signal labeled $\emptyset_3$ and a source connected to node 19. A capacitor 42 has a first electrode connected to node 19 and a second electrode connected to earth ground. An N-channel transistor 45 has a drain coupled to the common-mode reference voltage $V_{AG}$, a gate coupled to a control signal labeled $\emptyset_2$, and a source connected to both a first electrode of a capacitor 47 and a gate of transistor 12. A second electrode of capacitor 47 forms the positive input terminal. An N-channel transistor 48 has a drain connected to the first electrode of capacitor 47, a gate coupled to a control signal labeled $\emptyset_1$, and a source connected to output terminal 16 for providing a negative output. An N-channel transistor 52 has a drain coupled to the common-mode reference voltage $V_{AG}$, a gate coupled to control signal $\emptyset_2$, and a source connected to both a first electrode of a capacitor 53 and the gate of transistor 13. A drain of an N-channel transistor 54 is connected to the gate of transistor 13. A second electrode of capacitor 53 forms the negative input terminal. A gate of transistor 54 is coupled to control signal $\emptyset_1$, and a source of transistor 54 is connected to output node 18 for providing a positive output. An example of control signals $\emptyset_1$, $\emptyset_2$ and $\emptyset_3$ is illustrated in FIG. 2(B).

In operation, operational amplifier 10' provides a fully differential input and output structure which is selectively autozeroed to compensate for inherent offset voltage errors. During an autozero period, control signals $\emptyset_1$ and $\emptyset_2$ make transistors 45, 48, 52 and 54 conductive which selectively connects the negative input and positive output and the positive input and negative output to the known reference voltage $V_{AG}$. After a predetermined amount of time, transistors 45 and 52 become nonconductive and switch 41 is made conductive. This switching action disconnects $V_{AG}$ from the unity gain configured operational amplifier and charges a common-mode feedback control voltage onto capacitor 42 via transistor 41. The common-mode control voltage at node 19 represents the amount of negative feedback bias voltage required to maintain the common-mode output voltage of operational amplifier 10' at $V_{AG}$. After the common-mode control voltage has been charged onto capacitor 42 with amplifier 10' in unity gain, common-mode feedback amplifier 30 is disconnected from the main amplifier portion of operational amplifier 10' via transistor 41 in response to signal $\emptyset_3$. Transistors 48 and 54 respectively disconnect the negative and positive output terminals from the positive and negative input terminals, respectively, in response to control signal $\emptyset_1$. Operational amplifier 10' is now ready for valid circuit operation. Capacitors 47 and 53 function as A.C. coupling capacitors to the positive and negative inputs, respectively. No frequency compensating capacitor is needed for the main amplifier portion of amplifier 10' because the main amplifier portion only has one dominant frequency pole.

In the illustrated form, transistor 41 disconnects the common-mode voltage portion from the main amplifier of operational amplifier 10' because for some circuit operations such as a voltage comparison operation, operational amplifier 10' may become saturated. Once saturated, the value of the common-mode feedback voltage may not be accurate since transistors 21, 26 and 22 may not respond in a linear manner. Therefore, the stored correct voltage on capacitor 42 insures that a predetermined common-mode output voltage of $V_{AG}$ is maintained.

By now it should be apparent that a fully differential operational amplifier with common-mode D.C. feedback has been provided. The present invention provides good power supply noise rejection characteristic of fully differential operational amplifier structures. Accurate control of the output common-mode voltage has been provided in an operational amplifier structure having only one dominant frequency pole in the amplifier portion. Therefore, frequency compensating capacitors are only required in the common-mode feedback portion of the amplifier structure. In one form, the present invention may be implemented as an autozeroed operational amplifier in which a common-mode feedback control voltage is sampled onto a capacitor. Therefore, a plurality of circuit operations may be performed without the risk of saturating the common-mode voltage control portion of the amplifier and negatively affecting the accuracy of the common-mode output voltage.

While an embodiment has been disclosed using certain assumed parameters and specified transistor proportions, it should be understood that certain obvious modifications to the circuit or the given parameters will become apparent to those skilled in the art, and the scope of the invention should be limited only by the scope of the claims appended hereto.

We claim:

1. A fully differential operational amplifier comprising:
   first current source means for providing a first constant current;
   first differential input means coupled to the first current source means, for selectively receiving a first input voltage and providing a first output voltage in response thereto;
   second differential input means coupled to the current source means, for selectively receiving a second input voltage and providing a second output voltage in response thereto;
   first load means coupled to the first differential input means, for conducting a first differential current in response to a common-mode control voltage; and
   second load means coupled to the second differential input means, for conducting a second differential current in response to the common-mode control voltage, the improvement comprising:
   common-mode feedback means for providing the common-mode control voltage, comprising:
   first and second transistors, each transistor having a control electrode coupled to a predetermined one of said first and second output voltages and providing a respective portion of a first bias current;
   a third transistor having a control electrode coupled to a predetermined common-mode reference voltage, for providing a second bias current; and
   output means coupled to the first, second and third transistors, for providing the common-mode control voltage in proportion to a ratio of said first and second bias currents.

2. The fully differential operational amplifier of claim 1 further comprising:
   second current source means for providing a second constant source current to the first and second transistors.

3. The fully differential operational amplifier of claim 1 wherein the output means is a current mirror comprising fourth and fifth transistors, said fourth transistor coupled in series with both the first and second transistors and said fifth transistor coupled in series with the third transistor.

4. The fully differential operational amplifier of claim 1 further comprising:
   charge storage means coupled to the first and second load means, for selectively storing the common-mode control voltage; and
   switch means coupled between the charge storage means and the first and second load means, for selectively decoupling the common-mode feedback means from the first and second load means.

5. In a fully differential operational amplifier comprising: first current supply means for providing a first constant current;
   first differential input means coupled to the first current supply means, for selectively receiving a first input voltage and providing a first output voltage in response thereto;
   second differential input means coupled to the first current supply means, for selectively receiving a second input voltage and providing a second output voltage in response thereto;
   first load means coupled to the first differential input means, for conducting a first differential current in response to a common-mode control voltage; and
   second load means coupled to the second differential input means, for conducting a second differential current in response to the common-mode control voltage, common-mode feedback means for providing the common-mode control voltage, comprising:
   second current supply means for providing a second constant current;
   a first transistor of a first conductivity type having a first current electrode connected to the second current supply means, a control electrode connected to the first output voltage, and a second current electrode;
   a second transistor of the first conductivity type having a first current electrode connected to the second current supply means, a control electrode connected to the second output voltage, and a second current electrode connected to the second current electrode of the first transistor;
   a third transistor of the first conductivity type type having a first current electrode connected to the second current supply means, a control electrode coupled to a predetermined common-mode reference voltage, and a second current electrode;
   a fourth transistor of a second conductivity type type having both a first current electrode and a control electrode connected together and to the second current electrodes of the first and second transistors, and a second current electrode connected to a reference voltage terminal; and
   a fifth transistor of the second conductivity type type having a first current electrode connected to the second current electrode of the third transistor and connected to the first and second load means, a control electrode connected to the control electrode of the fourth transistor, and a second current electrode connected to the reference voltage terminal.

6. The fully differential operational amplifier of claim 5 further comprising:
   charge storage means coupled between the control electrodes of the fourth and fifth transistors and the first current electrode of the fifth transistor; and
   switch means coupled between the charge storage means and the first and second load means, for selectively decoupling the common-mode feedback means from the first and second load means.

* * * * *